United States Patent
Watanabe et al.

(10) Patent No.: US 11,107,692 B2
(45) Date of Patent: Aug. 31, 2021

(54) ETCHING METHOD

(71) Applicant: Tokyo Electron Limited, Tokyo (JP)

(72) Inventors: Hikaru Watanabe, Miyagi (JP); Ryosuke Ebihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 381 days.

(21) Appl. No.: 16/069,723

(22) PCT Filed: May 2, 2017

(86) PCT No.: PCT/JP2017/017273
§ 371 (c)(1),
(2) Date: Jul. 12, 2018

(87) PCT Pub. No.: WO2017/195709
PCT Pub. Date: Nov. 16, 2017

(65) Prior Publication Data
US 2020/0211854 A1  Jul. 2, 2020

(30) Foreign Application Priority Data
May 10, 2016  (JP) .............................. JP2016-094659

(51) Int. Cl.
*H01L 21/3065* (2006.01)
*H01L 21/02* (2006.01)
(Continued)

(52) U.S. Cl.
CPC .... *H01L 21/3065* (2013.01); *H01L 21/02126* (2013.01); *H01L 21/02315* (2013.01);
(Continued)

(58) Field of Classification Search
CPC .......... H01L 21/3065; H01L 21/02126; H01L 21/02315; H01L 21/02337; H01L 21/30621; H01L 21/32137
(Continued)

(56) References Cited

U.S. PATENT DOCUMENTS

2013/0105916 A1* 5/2013 Chang ............... H01L 21/31116
257/410
2015/0001687 A1* 1/2015 Zhang ................ H01L 21/0337
257/622
(Continued)

FOREIGN PATENT DOCUMENTS

JP  H10-303187 A  11/1998
JP  H11-260798 A   9/1999
(Continued)

OTHER PUBLICATIONS

International Search Report for PCT/JP2017/017273 dated Jul. 11, 2017.

*Primary Examiner* — Binh X Tran
(74) *Attorney, Agent, or Firm* — Pearne & Gordon LLP

(57) ABSTRACT

An etching method of etching a silicon nitride region with high selectivity is provided. In the etching method, a processing target object, having a silicon nitride region and a silicon-containing region having a composition different from the silicon nitride region, is accommodated in a processing vessel, and the silicon nitride region is selectively etched. In a first process, a deposit containing hydrofluorocarbon is formed on the silicon nitride region and the silicon-containing region by generating plasma of a processing gas containing a hydrofluorocarbon gas within the processing vessel. In a second process, the silicon nitride region is etched by radicals of the hydrofluorocarbon con-
(Continued)

tained in the deposit. The first process and the second process are repeated alternately.

20 Claims, 12 Drawing Sheets

(51) Int. Cl.
 *H01L 21/306* (2006.01)
 *H01L 21/311* (2006.01)
 *H01L 21/3213* (2006.01)
(52) U.S. Cl.
 CPC .. *H01L 21/02337* (2013.01); *H01L 21/30621* (2013.01); *H01L 21/31116* (2013.01); *H01L 21/32137* (2013.01)
(58) Field of Classification Search
 USPC ................................. 438/723, 724, 743, 744
 See application file for complete search history.

(56) References Cited

U.S. PATENT DOCUMENTS

2016/0079073 A1\* 3/2016 Matsui .............. H01J 37/32422
 438/694
2016/0247688 A1\* 8/2016 Zhu ................... H01L 21/31116

FOREIGN PATENT DOCUMENTS

| JP | 2002-319574 | 10/2002 |
| JP | 2016-027594 A | 2/2016 |
| JP | 2016-058590 A | 4/2016 |

\* cited by examiner

ETCHING METHOD

CROSS-REFERENCE TO RELATED APPLICATION

This Application is a U.S. national phase application under 35 U.S.C. § 371 of PCT Application No. PCT/JP2017/017273 filed on May 2, 2017, which claims the benefit of Japanese Patent Application No. 2016-094659 filed on May 10, 2016, the entire disclosures of which are incorporated herein by reference.

TECHNICAL FIELD

The various embodiments described herein pertain generally to an etching method.

BACKGROUND ART

Conventionally, researches on an etching method for silicon nitride have been conducted. Patent Document 1 describes a method of etching a nitride layer on a substrate anisotropically by using a gas containing hydrogen-rich hydrofluorocarbon, an oxidant and a carbon source.

Patent Document 2 discloses a method of etching silicon nitride at a deep position within a hole by using fluorine radicals originated from fluorocarbon. Patent Document 3 recites a method of etching silicon nitride by using $CH_2F_2$, $CH_3F$ or $CHF_3$.

Patent Document 1: Japanese Patent Laid-open Publication No. H11-260798

Patent Document 2: Japanese Patent Laid-open Publication No. 2002-319574

Patent Document 3: Japanese Patent Laid-open Publication No. H10-303187

DISCLOSURE OF THE INVENTION

Problems to be Solved by the Invention

The conventional etching methods, however, have a drawback in that etching selectivity for the silicon nitride is not sufficient.

In view of the foregoing, exemplary embodiments provide an etching method capable of etching silicon nitride with high selectivity.

Means for Solving the Problems

In an exemplary embodiment, there is provided a first etching method of selectively etching a silicon nitride region of a processing target object which is accommodated in a processing vessel and has the silicon nitride region and a silicon-containing region having a composition different from the silicon nitride region. The first etching method includes a first process of forming a deposit containing hydrofluorocarbon on the silicon nitride region and the silicon-containing region by generating plasma of a processing gas containing a hydrofluorocarbon gas within the processing vessel; and a second process of etching the silicon nitride region by radicals of the hydrofluorocarbon contained in the deposit. The first process and the second process are repeated alternately.

As for the deposit which is originated from the hydrofluorocarbon and formed in the first process, an amount of the deposit on the silicon nitride region is smaller than an amount of the deposit on the silicon-containing region having the different composition from the silicon nitride region. In the second process, if the radicals are applied to the deposit, the silicon nitride region is etched. Accordingly, as the first process and the second process are repeated alternately, the silicon nitride region is etched with high selectivity with respect to the silicon-containing region.

In a second etching method, the silicon-containing region contains at least one silicon compound selected from the group consisting of SiC, SiOC, SiON, SiCN, SiOCN and $SiO_2$. These silicon-containing materials accompany a larger amount of the hydrofluorocarbon-originated deposit as compared to the silicon nitride. Thus, the etching selectivity for the silicon nitride can be sufficiently achieved.

In a third etching method, the hydrofluorocarbon gas contains at least one gas selected from the group consisting of $CH_3F$, $CH_2F_2$, $CHF_3$. These hydrofluorocarbon gases have a smaller deposition amount on a surface of the silicon nitride region, as compared to other materials. Thus, the silicon nitride region can be sufficiently etched.

In a fourth etching method, a ratio between a period of the first process and a period of the second process is set such that an etching amount of the silicon nitride region is at least five times as large as an etching amount of the silicon-containing region. In this case, since the silicon nitride can be etched with sufficiently high selectivity, a deep hole or a deep groove, which cannot be formed in the prior art, can be easily formed.

In a fifth etching method, during the second process, the radicals of the hydrofluorocarbon contained in the deposit are generated by exposing the deposit to plasma of a rare gas. If the deposit is exposed to the plasma of the rare gas, ions of rare gas atoms collide with the deposit, so that the radicals of the hydrofluorocarbon are generated from the deposit. As a result, the silicon nitride region is etched depending on a surface state of the silicon nitride during the deposition and the generated radicals.

In a sixth etching method, the processing gas does not substantially contain oxygen. In this case, since surface oxidation does not take place as compared to a case where the processing gas contains oxygen, a difference in the deposition film caused by the difference in the materials may be easily generated. Here, the expression of "does not substantially contain oxygen" implies that oxygen is not intentionally introduced into the processing gas and is assumed to refer to a case where an oxygen gas concentration in the processing gas is equal to or less than $2.0 \times 10^{-10}$ mol/cm$^3$ (this oxygen gas concentration is calculated for a case where air having a vacuum level of 0.025 T (3.3 Pa) and containing 20% of oxygen is decompressed).

Effect of the Invention

According to the etching methods of the exemplary embodiment as described above, it is possible to etch the silicon nitride region with high selectivity.

DETAILED DESCRIPTION

Figure 1A:
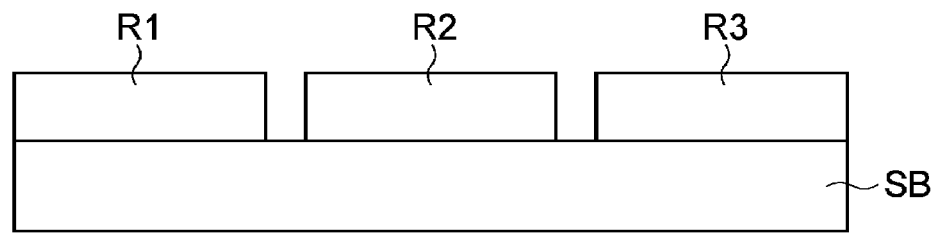
FIG. 1A to FIG. 1C are diagrams illustrating an etching target object according to an exemplary embodiment.

Hereinafter, various exemplary embodiments will be described with reference to accompanying drawings, which form a part of the description. In the various drawings, same or corresponding parts will be assigned same reference numerals.

Figure 1B:
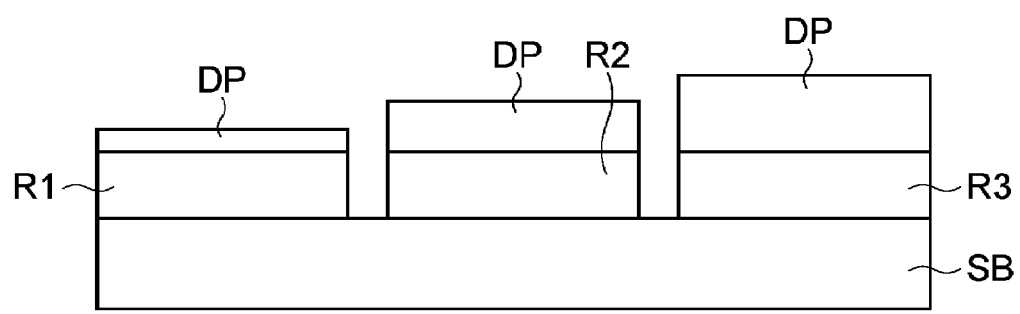
Figure 1C:
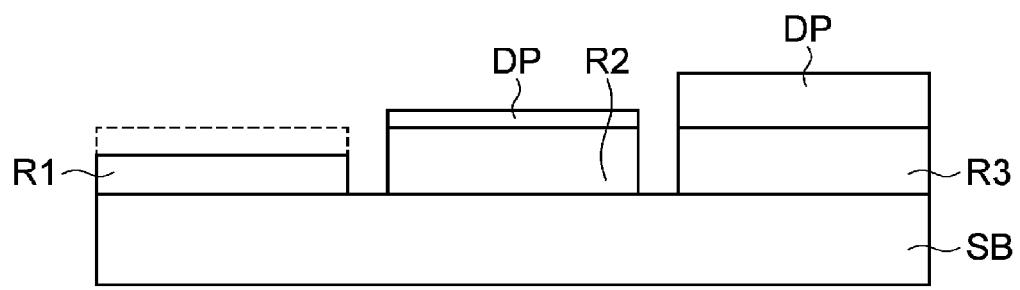

FIG. 1A to FIG. 1C are diagrams illustrating an etching target object according to an exemplary embodiment.

FIG. 1A shows a state in which three layers are formed on a substrate SB. That is, a processing target object has a first region R1, a second region R2 and a third region R3 on the substrate SB, and these first to third regions R1 to R3 are silicon-containing regions having different compositions. A material for the substrate SB is not particularly limited. Here, in the present exemplary embodiment, the substrate SB is made of, by way of example, Si. Further, in the present exemplary embodiment, the first region R1 is a silicon nitride region ($SiN_x$) (x is an appropriate number); the second region R2, a SiCN region; and the third region R3, a SiC region.

FIG. 1B is a diagram for describing a first process of an etching processing and illustrates a state in which a deposit DP is deposited on the first region R1, the second region R2 and the third region R3. The deposit DP is formed on surfaces of the respective regions as these regions are exposed to plasma of a processing gas containing a hydrofluorocarbon gas ($CH_3F$, $CH_2F_2$, or $CHF_3$). Further, since FIG. 1A to FIG. 1C are diagrams for describing the deposit on the first to third regions, illustration of a deposit formed on the substrate SB when a plasma processing is performed on this structure is omitted. To form the deposit DP, the processing target object is first accommodated in a processing vessel, and the plasma of the processing gas containing the hydrofluorocarbon gas is generated within the processing vessel so that the surfaces of the first region R1, the second region R2 and the third region R3 are exposed to the corresponding plasma. In this deposition process, the deposit on the first region R1 made of the silicon nitride has a smaller thickness as compared to the other two regions. Further, a thickness of the deposit DP formed on the second region R2 made of the SiCN is smaller than a thickness of the deposit DP on the third region R3 made of the SiC.

Subsequently, sputtering by a rare gas is performed.

FIG. 1C is a diagram for describing a second process of the etching processing and illustrates a state in which a part of the deposit DP and a surface layer of the first region R1 are removed through the sputtering by the rare gas (desirably, the rare gas may be Ar, but He, Ne, Kr, Xe and Rn may also be used). In the second process, by exposing the deposit DP to plasma of the rare gas, radicals of the hydrofluorocarbon contained in the deposit DP are generated. To elaborate, if the deposit DP is exposed to the plasma of the rare gas, ions of rare gas atoms collide with the deposit DP, so that the radicals of the hydrofluorocarbon are generated from the deposit DP. As a result, the first region R1 is etched depending on a surface state of the first region R1 (silicon nitride) during the deposition and the generated radicals. Further, since the plasma of the rare gas sputters a surface of the deposit DP, a thickness of the deposit DP is decreased.

Thereafter, by repeating the first process and the second process alternately, the first region R1 is selectively etched.

As stated above, in the etching method according to the exemplary embodiment, the processing target object having the silicon nitride region (the first region R1) and the silicon-containing regions (the second region R2 and the third region R3) having the compositions different from that of the silicon nitride region is accommodated in the processing vessel, and the first region R1 is selectively etched. This etching method includes the first process of forming the deposit DP containing the hydrofluorocarbon on the first region R1, the second region R2 and the third region R3 by generating the plasma of the processing gas containing the hydrofluorocarbon gas within the processing vessel; and the second process of etching the first region R1 by the radicals of the hydrofluorocarbon contained in the deposit DP. The first process and the second process are alternately repeated.

As for the hydrofluorocarbon-originated deposit DP formed in the first process, an amount of the corresponding deposit on the first region (silicon nitride region) is smaller than amounts of the deposit on the silicon-containing regions having the different compositions from the first region. If the radicals are applied to the deposit DP in the second process, the first region R1 is etched. Accordingly, as the first process and the second process are repeated alternately, the silicon nitride region is etched with high selectivity with respect to the other silicon-containing regions.

Further, in the above-described etching method, the silicon-containing region constituting the second region R2 or the third region R3 may contain at least one silicon compound selected from the group consisting of SiC, SiOC, SiON, SiCN, SiOCN and $SiO_2$. As will be described later, as compared to the silicon nitride, these silicon-containing materials generate a larger amount of hydrofluorocarbon-originated deposit DP. Thus, the etching selectivity for the silicon nitride can be sufficiently achieved.

Furthermore, the hydrofluorocarbon gas contains at least one gas selected from the group consisting of $CH_3F$, $CH_2F_2$, $CHF_3$. These hydrofluorocarbon gases have a smaller deposition amount on the surface of the silicon nitride region, as compared to other materials. Thus, the silicon nitride region can be sufficiently etched.

In case that an internal pressure of the processing vessel is set to 30 mT (4.0 Pa); 250 W is applied to an upper electrode of a plasma processing apparatus; a DC voltage applied to the upper electrode is set to 0 V; a substrate temperature is set to 60° C.; and an Ar gas (1000 sccm) and a hydrofluorocarbon gas ($CH_3F$ (25 sccm)) are used as the processing gas, a ratio of the deposition amounts of the deposit DP on the first region R1, the second region R2 and the third region R3 is found to be 1:3:5. In case that $CHF_3$ is used as the hydrofluorocarbon gas under the same conditions, a ratio between the deposition amount on the first region R1 and the deposition amount on the third region R3 becomes 1:4 at 60° C. Further, in case that the $CHF_3$ is used, the formed deposit and a material directly thereunder are etched at different etching rates by the Ar sputtering in the second process with a lapse of sputtering time. In this case, $SiO_2$ is most readily etched, followed by $SiN_X$ and SiC in this sequence.

Now, the plasma processing apparatus equipped with the processing vessel will be explained.

Figure 2:
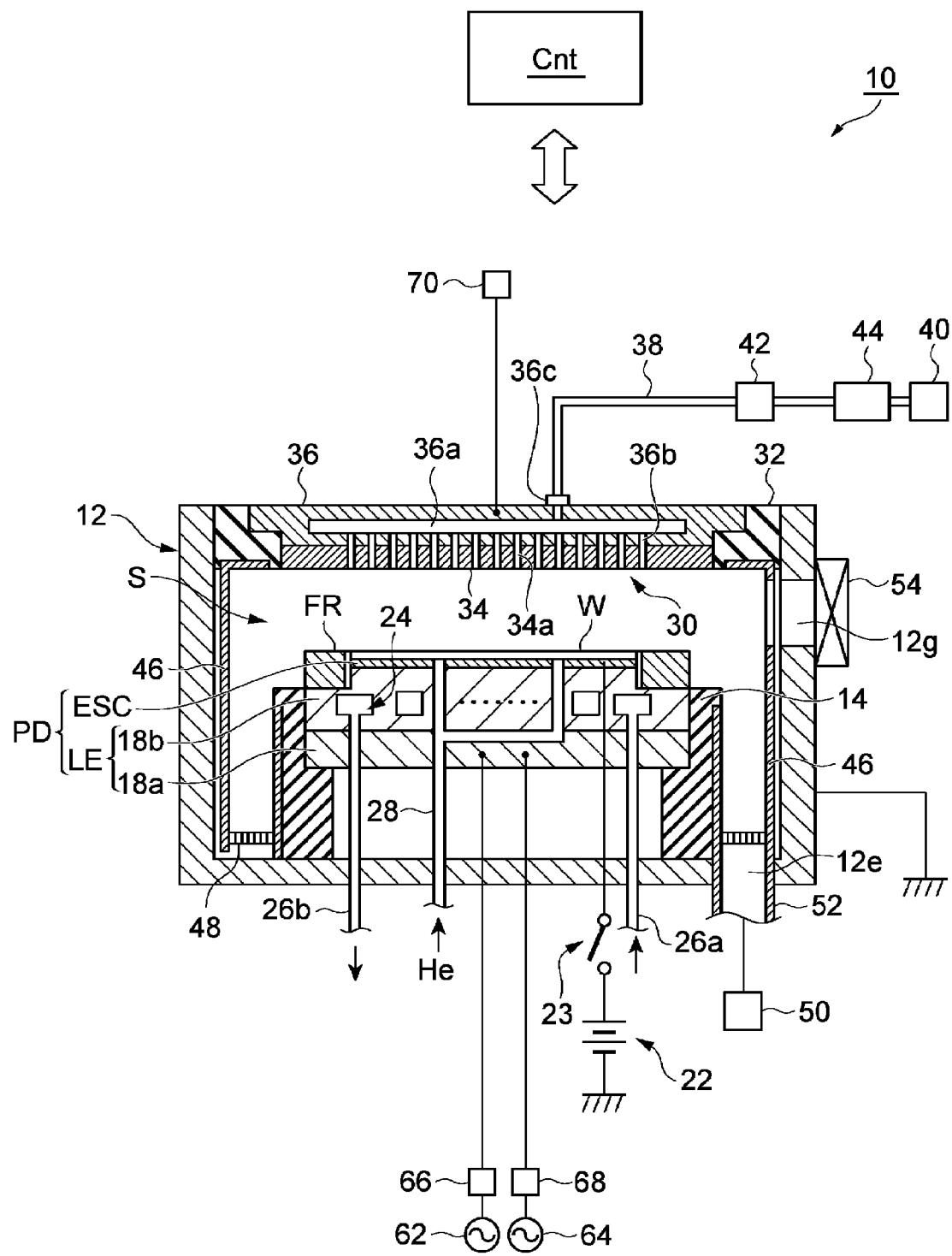
FIG. 2 is a diagram illustrating a plasma processing apparatus according to the exemplary embodiment.

FIG. 2 is a diagram illustrating the plasma processing apparatus according to the exemplary embodiment. A plasma processing apparatus 10 shown in FIG. 2 is configured as a capacitively coupled plasma etching apparatus and equipped with a substantially cylindrical processing vessel 12. An inner wall surface of the processing vessel 12 is made of, by way of example, anodically oxidized aluminum. This processing vessel 12 is frame-grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is supplied into the coolant path 24 to be circulated therein. A temperature of the wafer W held by the electrostatic chuck ESC is controlled by adjusting a temperature of the coolant.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. In the exemplary embodiment, the upper electrode 30 is configured such that a distance from the top surface of the mounting table PD, i.e., a mounting surface on which the wafer W is placed is variable in a vertical direction. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. Multiple gas through holes 36b are extended downwards from the gas diffusion space 36a, and these gas through holes 36b communicate with the gas discharge holes 34a, respectively. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources such as a source of the hydrofluorocarbon gas and a source of the rare gas. When necessary, the gas source group may further include a source of an oxygen ($O_2$) gas. The hydrofluorocarbon gas is a gas containing at least one of, by way of non-limiting example, $CH_3F$, $CH_2F_2$ and $CHF_3$. Further, the rare gas is a gas containing at least one of various rare gases such as an Ar gas and a He gas.

The valve group 42 includes a multiple number of valves, and the flow rate controller group 44 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 44.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

At the bottom side of the processing vessel 12, a gas exhaust plate 48 is provided between the supporting member 14 and a side wall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52. The gas exhaust device 50 includes a vacuum pump such as a turbo molecular pump, and is capable of decompressing the space within the processing vessel 12 to a required vacuum level. Further, a carry-in/out opening 12g for the wafer W is provided at the side wall of the processing vessel 12, and the carry-in/out opening 12g is opened or closed by a gate valve 54.

The plasma processing apparatus 10 further includes a first high frequency power supply 62 and a second high frequency power supply 64. The first high frequency power supply 62 is configured to generate a high frequency power for plasma generation having a frequency ranging from 27 MHz to 100 MHz, for example, 40 MHz. The first high frequency power supply 62 is connected to the lower electrode LE via a matching device 66. The matching device 66 is a circuit configured to match an output impedance of the first high frequency power supply 62 and an input impedance at a load side (lower electrode LE side).

The second high frequency power supply 64 is configured to generate a second high frequency power for ion attraction into the wafer W, that is, high frequency bias power having a frequency ranging from 400 kHz to 40 MHz, for example, 13 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side).

Further, the plasma processing apparatus 10 is further equipped with a DC power supply 70. The DC power supply 70 is connected to the upper electrode 30. The DC power supply 70 is configured to generate a negative DC voltage and apply this DC voltage to the upper electrode 30. If the negative DC voltage is applied to the upper electrode 30, positive ions existing in a processing space S collide with the electrode plate 34. Accordingly, secondary electrons and/or silicon may be released from the electrode plate 34.

Further, in the exemplary embodiment, the plasma processing apparatus 10 may further include a control unit Cnt. The control unit Cnt is implemented by a computer including a processor, a storage unit, an input device, a display device, and so forth, and is configured to control individual components of the plasma processing apparatus 10. In the control unit Cnt, an operator can input commands through the input device to manage the plasma processing apparatus 10, and an operational status of the plasma processing apparatus 10 can be visually displayed on the display device. Further, the storage unit of the control unit Cnt stores therein a control program for controlling various processings performed in the plasma processing apparatus 10 by the processor, or a program for allowing each component of the plasma processing apparatus 10 to perform a processing according to processing conditions, i.e., a processing recipe.

In the aforementioned first process, a Si wafer W is used as an example of the substrate, and the aforementioned hydrofluorocarbon gas is supplied into the processing vessel 12 from the gas source group 40 via the flow rate controller group 44, the valve group 42 and the gas supply line 38. Further, the high frequency power from the first high frequency power supply 62 is supplied to the lower electrode LE, and the high frequency bias power from the second high frequency power supply 64 is supplied to the lower electrode LE.

Further, in the first process, a pressure of the space within the processing vessel 12 is set to a preset pressure by the gas exhaust device 50. By way of example, the pressure of the space within the processing vessel 12 is set to a pressure within a range from 20 mTorr (2.666 Pa) to 50 mTorr (6.666 Pa). In addition, in the first process, a distance between the upper electrode 30 and the top surface of the mounting table PD is set to be in a range from 20 mm to 50 mm. Accordingly, plasma of the processing gas is generated within the processing vessel 12, and the wafer W placed on the mounting table PD is exposed to this plasma. Moreover, in the first process, the negative DC voltage may be applied to the upper electrode 30 from the DC power supply 70. When the first process is performed, operations of the individual components of the plasma processing apparatus 10 may be controlled by the control unit Cnt.

In the first process, initially, active species of atoms and/or molecules originated from the hydrofluorocarbon, for example, active species of fluorine and/or hydrofluorocarbon collide with the first to third regions R1 to R3. Accordingly, in the first process, the deposit DP is formed on the first region R1. The film thickness of the deposit DP increases with a lapse of a processing time of the first process. In this first process, a surface state of the first region R1 is slightly modified.

Further, the processing gas used in the first process does not substantially contain oxygen. In this case, since surface oxidation does not take place as compared to a case where the processing gas contains oxygen, a difference in the deposition film caused by the difference in the materials may be easily generated. Here, the expression of "does not substantially contain oxygen" implies that oxygen is not intentionally introduced into the processing gas and is assumed to refer to a case where an oxygen gas concentration in the processing gas is equal to or less than $2.0 \times 10^{-10}$ mol/cm$^3$ (this oxygen gas concentration is calculated for a case where air having a vacuum level of 0.025 T (3.3 Pa) and containing 20% of oxygen is decompressed).

In the second process, the Ar is used as the rare gas, and sputtering of the deposit DP is performed by generating plasma of the Ar gas. The first region R1 is etched by the radicals of the hydrofluorocarbon contained in the deposit DP. In the second process, the wafer W after being subjected to the first process is exposed to the plasma of the rare gas. A processing time of the second process and the processing time of the first process may be set as required. In the exemplary embodiment, a ratio of the processing time of the first process with respect to a sum of the processing times of the first and second processes may be set to be in the range from 5% to 30%.

In case of performing the second process by using the plasma processing apparatus 10, the rare gas is supplied from the gas source group 40. Further, in the second process, if the deposit remains on the SiN$_X$, an oxygen gas (O$_2$ gas) may also be applied along with the rare gas. Furthermore, in the second process, the high frequency power from the first high frequency power supply 62 is supplied to the lower electrode LE. Further, in the second process, the high frequency bias power from the second high frequency power supply 64 may also be supplied to the lower electrode LE. By way of example, the pressure of the space within the processing vessel 12 may be set to be in the range from 20 mTorr (2.666 Pa) to 50 mTorr (6.666 Pa). Moreover, in the second process, the distance between the upper electrode 30 and the top surface of the mounting table PD is set to be in the range from 20 mm to 50 mm. Accordingly, the plasma of the rare gas is generated within the processing vessel 12, and the wafer W placed on the mounting table PD is exposed to this plasma. Further, in the second process, the negative DC voltage may be applied to the upper electrode 30 from the DC power supply 70. In addition, while the second process is performed, the operations of the individual components of the plasma processing apparatus 10 may be controlled by the control unit Cnt.

In the second process, active species of the rare gas, for example, ions of atoms of the rare gas collide with the deposit DP. The etching of the first region R1 is performed by the hydrofluorocarbon radicals in the deposit DP. Further, through the second process, the film thickness of the deposit DP on the first region R1 is decreased. In addition, in the second process, film thicknesses of the deposit DP on the second region R2 and the third region R3 are also decreased.

In the above-stated etching method, the first process is performed again after the second process is completed. The film thickness of the deposit DP is reduced through the previous second process. Thus, if the wafer W is exposed to the plasma of the aforementioned processing gas by performing the first process again, the first region R1 can be further etched. Thereafter, by performing the second process again, the first region R1 can be etched by the hydrofluorocarbon radicals in the deposit DP.

In the above-described etching method, it is determined whether a stop condition is satisfied. The stop condition is satisfied when a repetition number of a cycle including the first process and the second process reaches a preset number of times. If the stop condition is not satisfied, the cycle including the first process and the second process is performed again. If the stop condition is met, on the other hand, the etching is ended.

In the above-stated etching method, by alternately repeating the first process and the second process multiple times, the first region R1 can be continually etched. Further, in the above-described etching method, the first region R1 can be etched selectively with respect to the second region R2 and the third region R3.

Moreover, in the above-described etching method, only an etching amount EA1 of the first region R1 (silicon nitride region) is increased, whereas an etching amount EA2 of the second region R2 and the third region R3 (silicon-containing regions) becomes substantially zero. A ratio (R=T2/T1) between a period T1 (sec) of the first process and a period T2 (sec) of the second process may be set to be $3 \leq R \leq 20$.

In this case, since the silicon nitride can be etched with sufficiently high selectivity, a deep hole or a deep groove, which cannot be formed in the prior art, can be easily formed.

Figure 3:
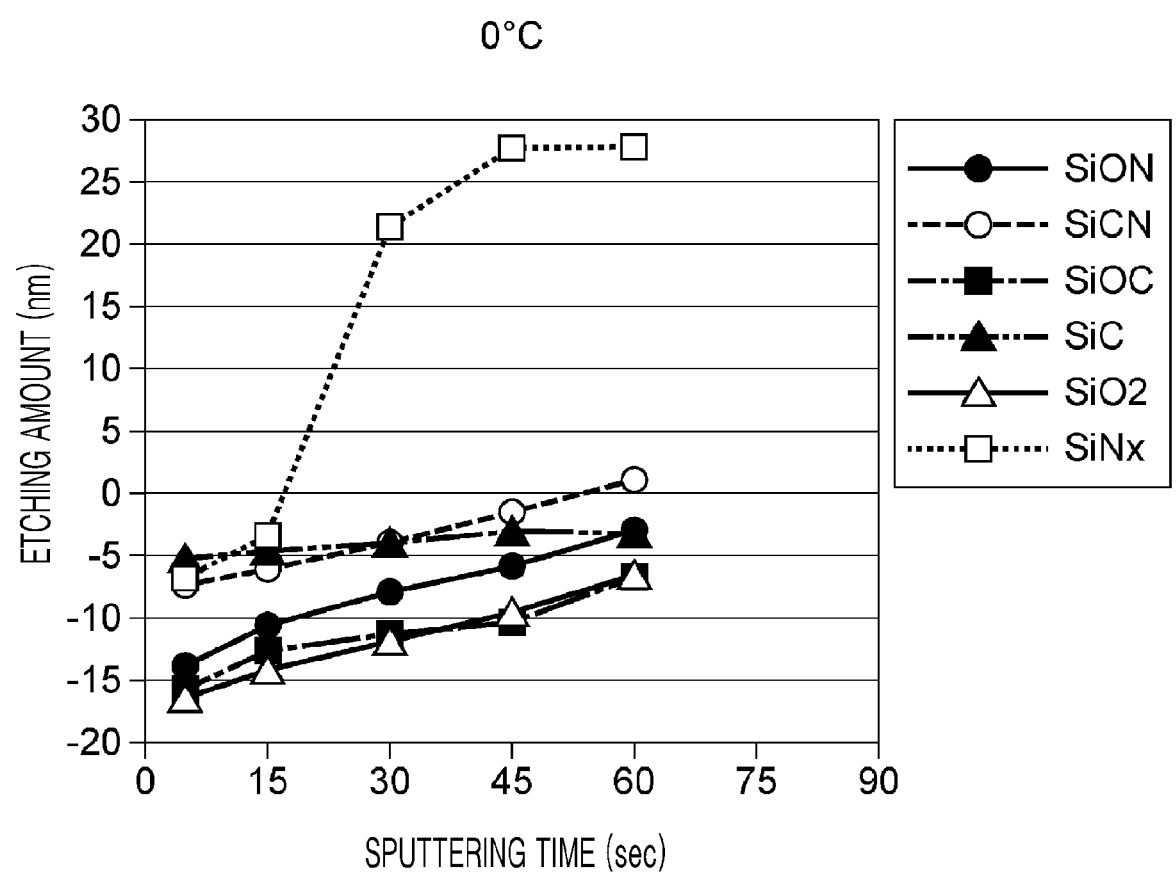
FIG. 3 is a graph showing a relationship between a sputtering time (sec) and an etching amount (nm).

FIG. 3 is a graph showing a relationship between the sputtering time (the period T2 of the second process) (sec) and the etching amounts (nm) of individual regions.

As basic conditions, in the first process, a substrate temperature TEMP is set to 0° C.; an internal pressure of the processing vessel is set to 30 mT; high frequency powers of 100 W and 0 W are applied to the upper electrode and the lower electrode, respectively; and CH$_3$F and Ar are mixed at a ratio of 50:1000 as the processing gas. Further, in the second process, the substrate temperature TEMP is set to 0° C.; the internal pressure of the processing vessel is set to 30 mT; high frequency powers of 100 W and 50 W are applied to the upper electrode and the lower electrode, respectively; and CH$_3$F and Ar are mixed at a ratio of 0:1000 as the processing gas. The tendency shown on this graph is also observed in experiments where the substrate temperature is set to be in the range from 0° C. to 60° C.

Experiments are performed by setting the first period T1 to be 5 sec and the second period T2 to be 5 sec, 15 sec, 30 sec, 45 sec and 60 sec. If the second period T2, which is the sputtering time, becomes equal to or larger than 30 sec, the etching amount of the first region (silicon nitride) is dramatically increased as compared to other materials (SiON, SiCN, SiOC, SiC, SiO$_2$). Further, if it is assumed that SiOCN has a state between SiON and SiCN, the etching amount of the SiOCN is also dramatically increased.

If R (=T2/T1) is equal to or larger than 6 and equal to or less than 12 at the substrate temperature of 0° C., the etching amount of the first region (silicon nitride) can be increased as compared to those of the other materials.

Figure 4:
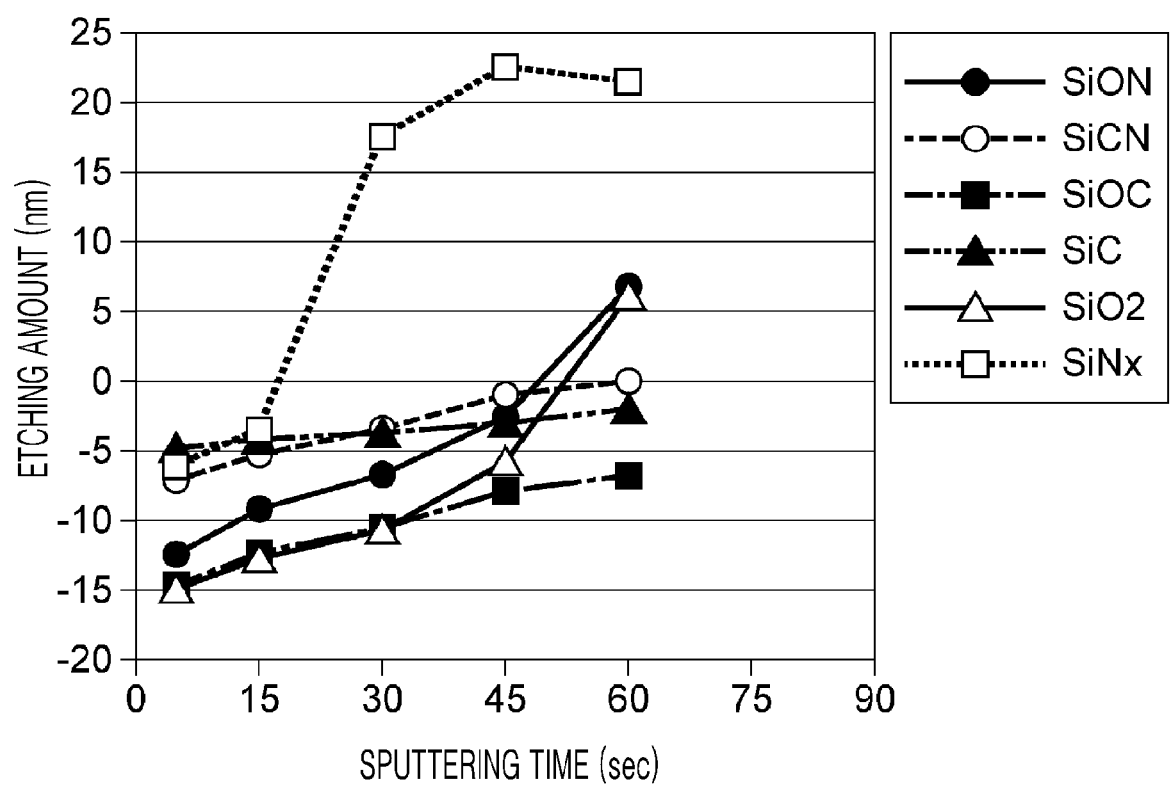
FIG. 4 is a graph showing a relationship between the sputtering time (sec) and the etching amount (nm).

FIG. 4 is a graph showing a relationship between the sputtering time (the period T2 (sec) of the second process) and the etching amounts (nm) of the respective regions.

This graph is obtained under the conditions where the substrate temperature is changed to 20° C. from the aforementioned basic conditions.

The experiments are performed by setting the first period T1 to be 5 sec and the second period T2 to be 5 sec, 15 sec, 30 sec, 45 sec and 60 sec. If the second period T2, which is the sputtering time, becomes equal to or larger than 30 sec, the etching amount of the first region (silicon nitride) is dramatically increased as compared to those of other materials (SiON, SiCN, SiOC, SiC, SiO$_2$).

If R (=T2/T1) is equal to or larger than 6 and equal to or less than 9 at the substrate temperature of 20° C., the etching amount of the first region (silicon nitride) can be increased as compared to those of the other materials. Meanwhile, if R (=T2/T1) is equal to or larger than 9, the etching amount of the first region can be set to be 5 times as large as those of SiON and SiO$_2$.

Figure 5:
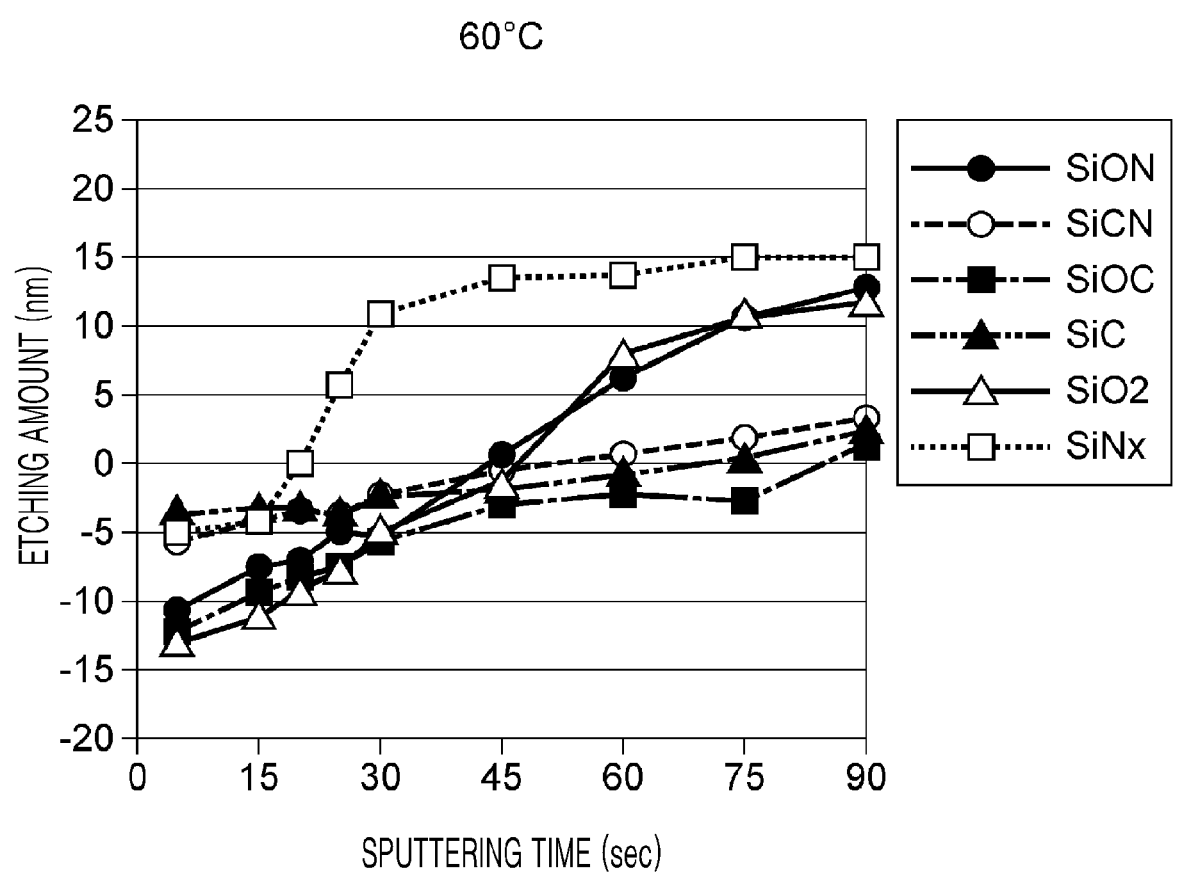
FIG. 5 is a graph showing a relationship between the sputtering time (sec) and the etching amount (nm).

FIG. 5 is a graph showing a relationship between the sputtering time (the period T2 (sec) of the second process) and the etching amounts (nm) of the respective regions.

This graph is obtained under the conditions where the substrate temperature is changed to 60° C. from the aforementioned basic conditions.

The experiments are performed by setting the first period T1 to be 5 sec and the second period T2 to be 5 sec, 15 sec, 20 sec, 25 sec, 30 sec, 45 sec, 60 sec, 75 sec and 90 sec. If the second period T2, which is the sputtering time, becomes equal to or larger than 30 sec, the etching amount of the first region (silicon nitride) is dramatically increased as compared to those of other materials (SiON, SiCN, SiOC, SiC, SiO$_2$).

If R (=T2/T1) is equal to or larger than 5 and equal to or less than 6 at the substrate temperature of 60° C., the etching amount of the first region (silicon nitride) can be increased as compared to those of the other materials.

Figure 6:
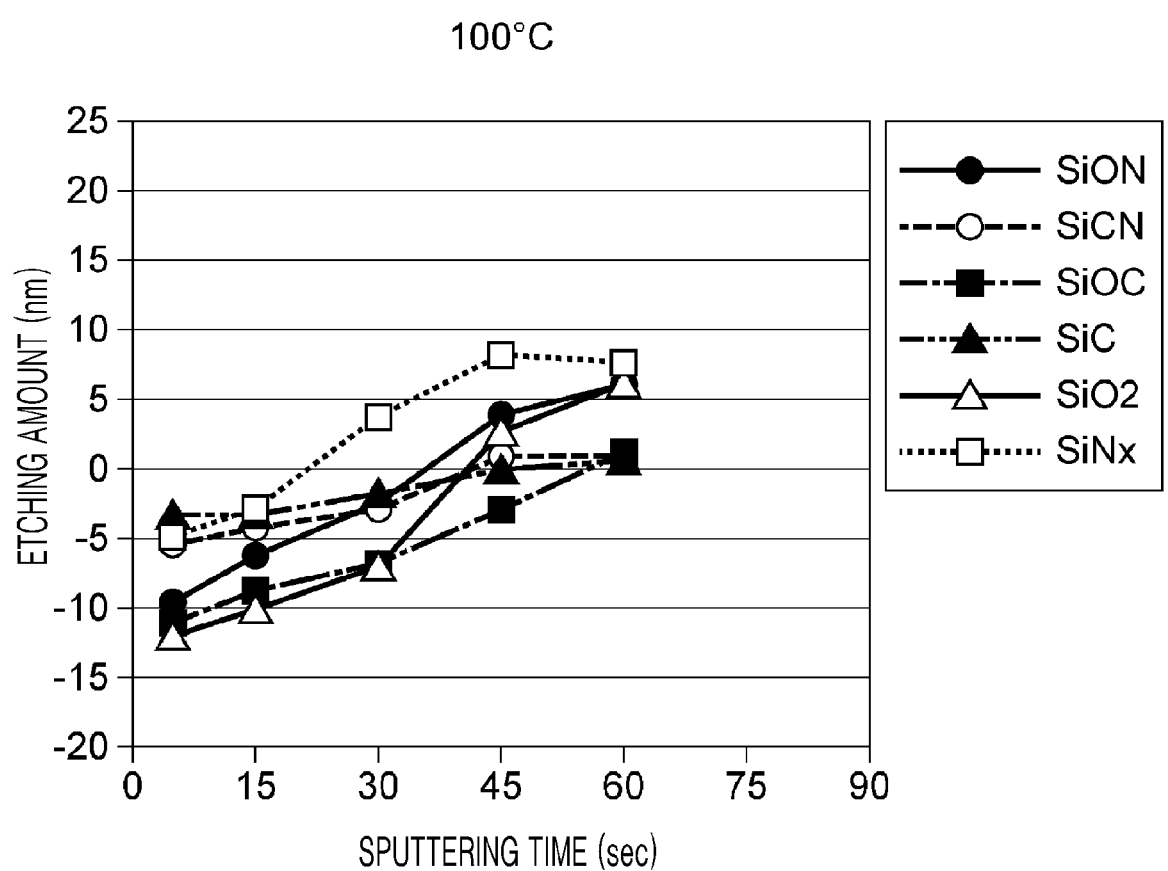
FIG. 6 is a graph showing a relationship between the sputtering time (sec) and the etching amount (nm).

FIG. 6 is a graph showing a relationship between the sputtering time (the period T2 (sec) of the second process) and the etching amounts (nm) of the respective regions.

This graph is obtained under the conditions where the substrate temperature is changed to 100° C. from the aforementioned basic conditions.

The experiments are performed by setting the first period T1 to be 5 sec and the second period T2 to be 5 sec, 15 sec, 30 sec, 45 sec and 60 sec. If the second period T2, which is the sputtering time, becomes equal to or larger than 30 sec, the etching amount of the first region (silicon nitride) is increased as compared to those of the other materials (SiON, SiCN, SiOC, SiC, SiO$_2$).

If R (=T2/T1) is equal to or larger than 6 at the substrate temperature of 100° C., the etching amount of the first region (silicon nitride) can be increased as compared to those of the other materials.

As stated above, in the first and second processes, the etching selectivity is improved when the temperature TEMP of the substrate as the processing target object is in the range from 0° C. to 100° C. Particularly, this effect becomes conspicuous at the substrate temperature ranging from 0° C. to 60° C., and more conspicuous at the substrate temperature ranging from 0° C. to 20° C.

Figure 7:
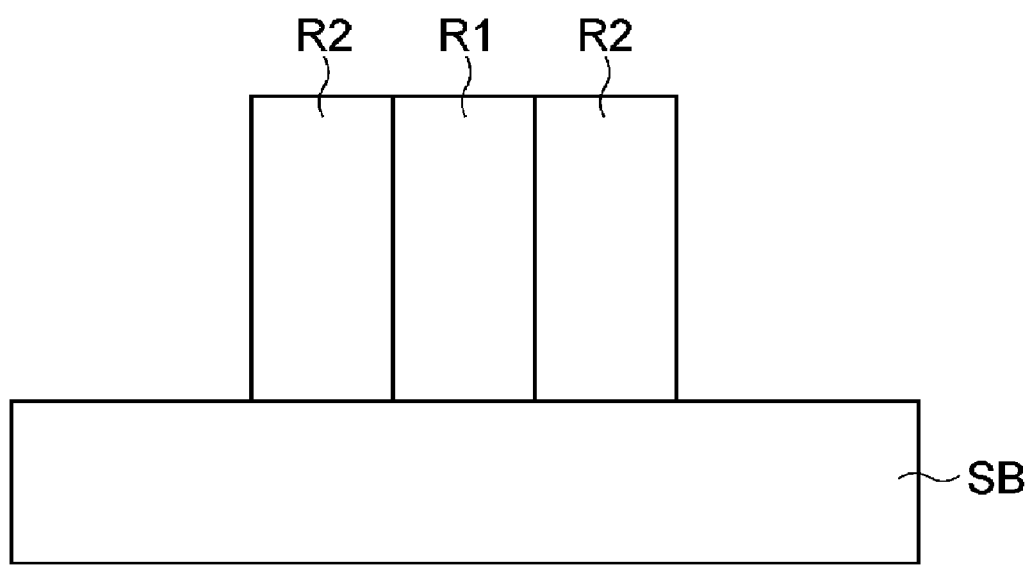
FIG. 7 is a diagram illustrating a longitudinal cross sectional structure of a processing target object.

FIG. 7 is a diagram illustrating a longitudinal sectional structure of a processing target object.

A first region R1 is provided on a substrate SB, and a second region R2 is provided at both sides of the first region R1. These regions may have a fin structure, and a longitudinally elongated structure is used as any of various electronic circuit devices such as a transistor and a capacitor. The aforementioned etching is performed on this structure.

Figure 8:
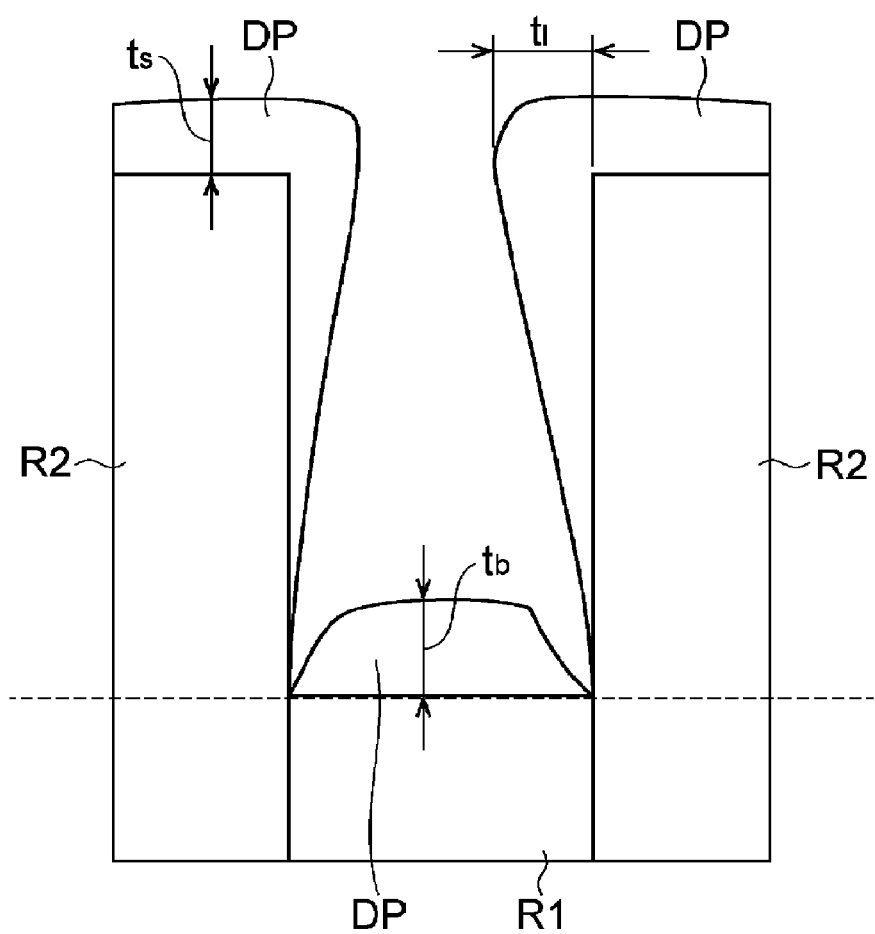
FIG. 8 is a diagram for describing a longitudinal cross sectional structure of the processing target object after an etching processing is begun.

FIG. 8 is a diagram illustrating a longitudinal sectional structure of the processing target object after the etching processing is begun.

In this etching, a deep recess is formed at a central portion, and a bottom surface of the recess becomes a surface of the first region R1, and the second region R2 remains at both sides of the first region R1. A deposit DP is formed on a side surface and a bottom surface of the recess, and, also, on an end surface of an opening of the recess.

A maximum value of the thickness of the deposit DP on a top surface of the second region R2 is referred to as $t_s$; a maximum value of a protrusion amount of the deposit DP protruded inwardly from the side surface of the recess, $t_1$; a maximum value of the thickness of the deposit DP formed on the surface of the first region R1 located at a bottom portion of the recess, $t_b$.

Figure 9:
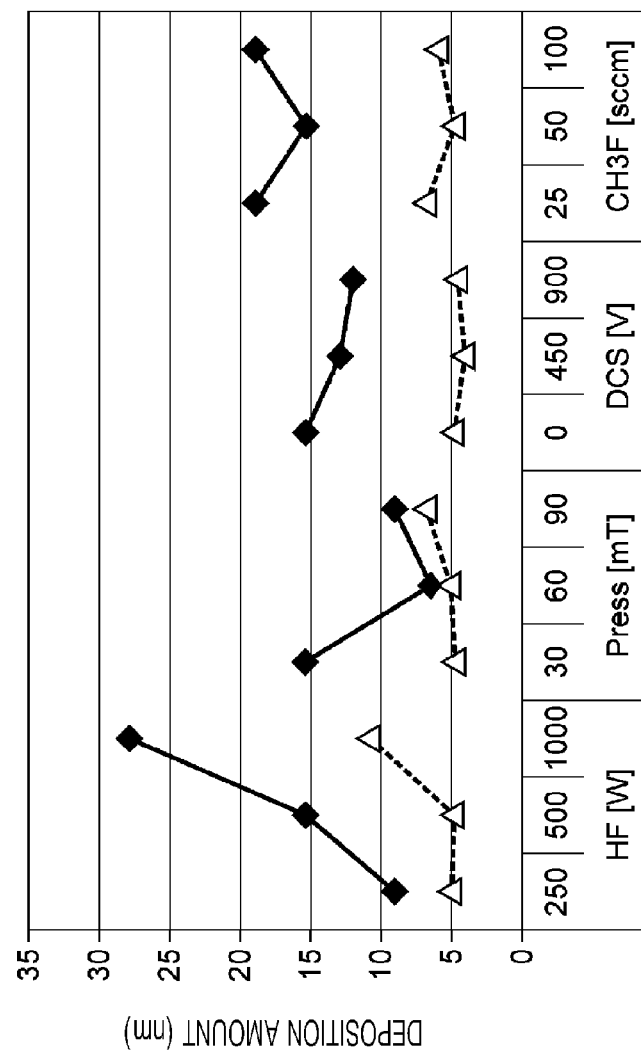
FIG. 9 is a graph for describing a variation of a deposition amount (nm) under various conditions.

FIG. 9 is a graph for describing a variation of a deposition amount (nm) under various conditions.

As basic conditions, in the first process, the substrate temperature TEMP is set to 60° C.; $CH_3F$ is used as the processing gas; the internal pressure (press) of the processing vessel is set to 30 mT; the high frequency power HF of 500 W is applied to the upper electrode; the high frequency power of 0 W is applied to the lower electrode; and the DC voltage DCS of the DC power supply 70 is set to 0 V; $CH_3F$ and Ar are mixed at a ratio of 50:1000. If the various parameters are varied, it is found out that the deposition amount tends to increase as the power level of the high frequency power HF increases.

Figure 10:
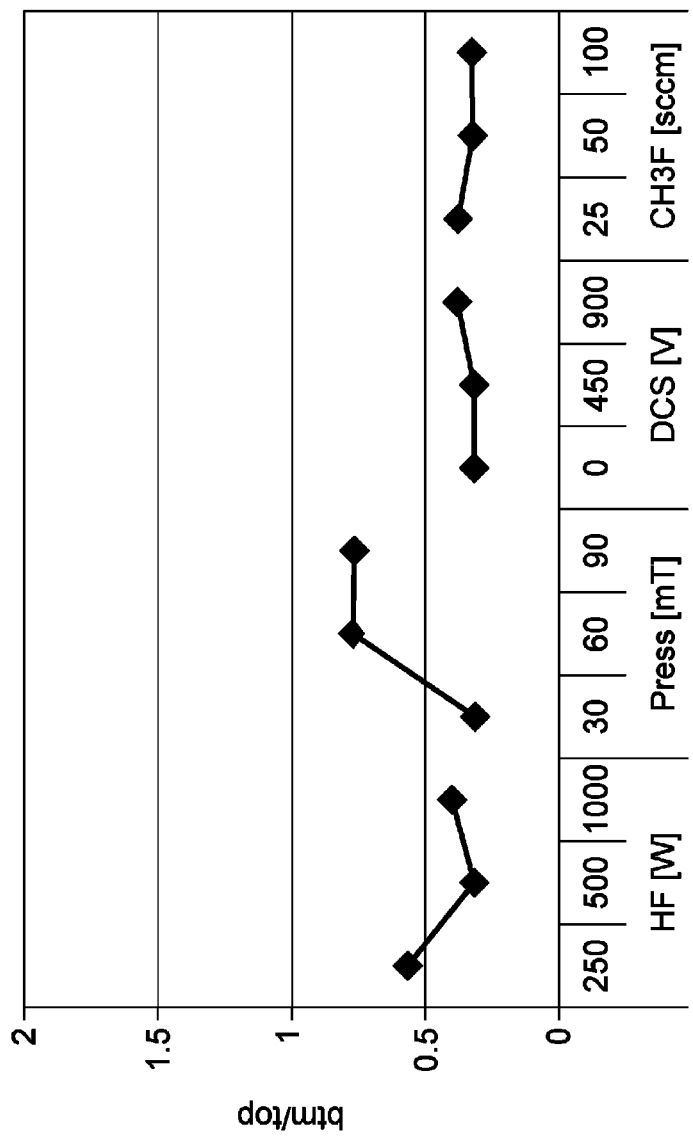
FIG. 10 is a graph for describing a variation of a deposition thickness ratio (btm/top) under various conditions.

FIG. 10 is a graph showing a thickness ratio (btm/top) of the deposit under the conditions of FIG. 9. In the above-stated deposition process, the thickness ratio (btm/top) may fall within the range from 0.25 to 0.75 even if the conditions are changed.

Figure 11:
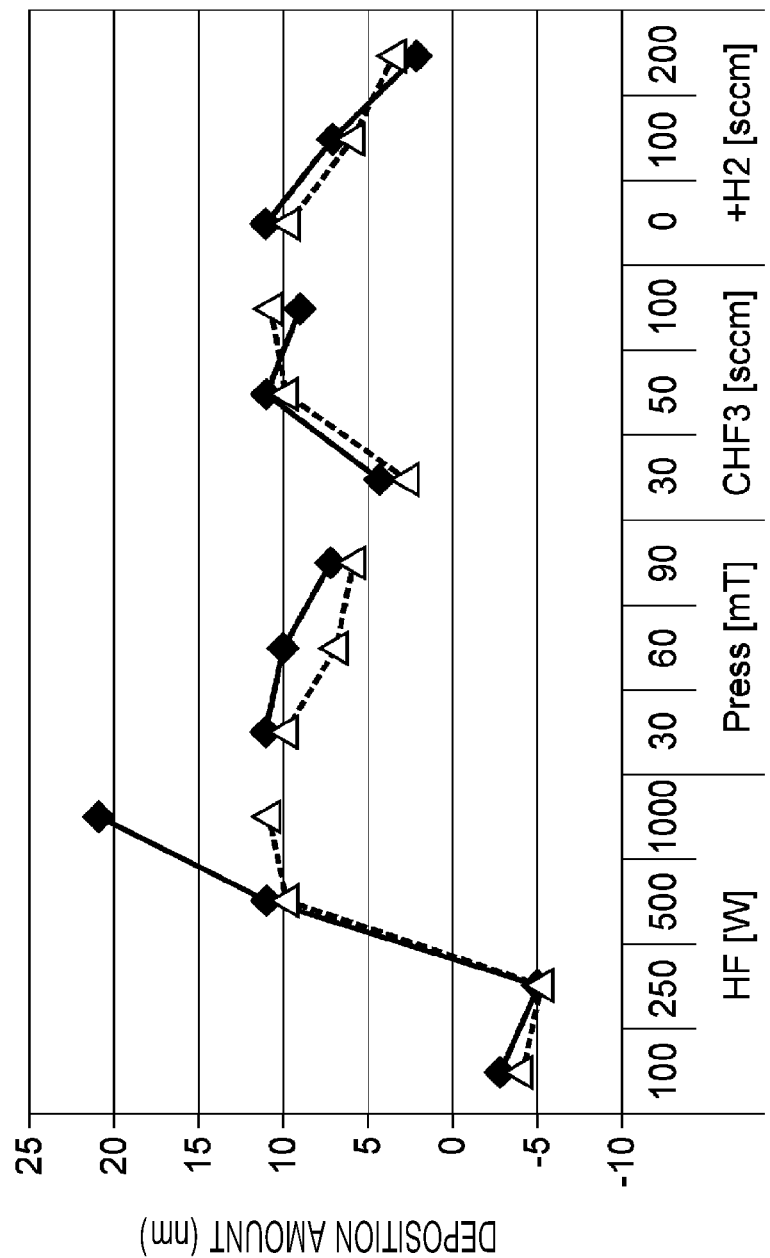
FIG. 11 is a graph for describing a variation of a deposition amount (nm) under various conditions.

FIG. 11 is a graph for describing a variation of the deposition amount (nm) under various conditions.

As basic conditions, in the first process, the substrate temperature TEMP is set to 60° C.; $CH_3F$ is used as the processing gas; the internal pressure (press) of the processing vessel is set to 30 mT; the high frequency power HF of 500 W is applied to the upper electrode; the high frequency power of 0 W is applied to the lower electrode; and the DC voltage DCS of the DC power supply 70 is set to 0 V; $CH_3F$ and Ar are mixed at a ratio of 50:1000. While varying the various parameters, it is found out that the deposition amount tends to increase as the power level of the high frequency power HF increases.

Figure 12:
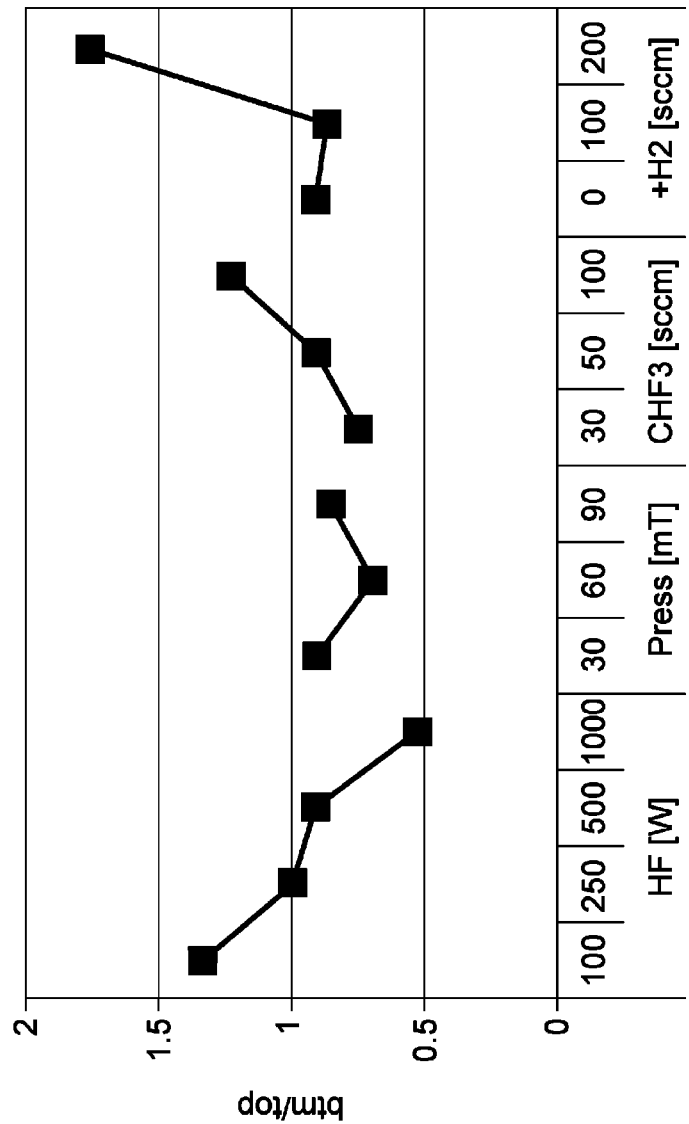
FIG. 12 is a graph for describing a variation of a deposition thickness ratio (btm/top) under various conditions.

FIG. 12 is a graph showing the thickness ratio (btm/top) of the deposit under the conditions of FIG. 11. In the above-stated deposition process, the thickness ratio (btm/top) may fall within the range from 0.45 to 1.75 even if the conditions are changed.

Furthermore, in the above-described etching method, the processing gas used in the first process does not contain oxygen. If $CH_3F$, Ar and $O_2$ are simply mixed at a ratio of 30:50:0~60 (sccm) and the silicon nitride is etched at a temperature of 60° C. for 60 seconds, the selective etching rate of the silicon nitride is 12.6 times as high as that of SiC at maximum ($O_2$ flow rate: 15 sccm), and the selective etching rate of the silicon nitride is 7.5 times as high as that of SiOC at maximum ($O_2$ flow rate: 15 sccm). When the aforementioned first and second processes are performed, these etching ratios become infinite at maximum. As can be seen from these experiments, highly selective etching is enabled.

So far, the various exemplary embodiments have been described. However, the above-described exemplary embodiments are not limiting and various changes and modifications may be made. By way of example, in the above description, the capacitively coupled plasma processing apparatus 10 is described as an example of the plasma processing apparatus used to implement the above-stated etching method. However, any of various kinds of plasma processing apparatus using various kinds of plasma sources may be used. By way of non-limiting example, various kinds of plasma processing apparatuses such as an inductively coupled plasma processing apparatus and a plasma processing apparatus using a surface wave such as a microwave as a plasma source may be used.

EXPLANATION OF CODES

10: Plasma processing apparatus
12: Processing vessel
PD: Mounting table
ESC: Electrostatic chuck
LE: Lower electrode
30: Upper electrode
40: Gas source group
50: Gas exhaust device
62: First high frequency power supply
64: Second high frequency power supply
70: DC power supply
W: Wafer
DP: Deposit
R1: First region
R2: Second region

We claim:

1. An etching method, comprising:
    accommodating, within a processing vessel, a processing target object having a silicon nitride region and a silicon-containing region, wherein the silicon-containing region has a composition different from the silicon nitride region, and the silicon nitride region and the silicon-containing region are exposed;
    a first process of forming a deposit containing hydrofluorocarbon on the silicon nitride region and the silicon-containing region by generating plasma from a processing gas containing a hydrofluorocarbon gas within the processing vessel; and
    a second process of sputtering the deposit by active species of atoms of a rare gas in plasma generated from the rare gas and etching the silicon nitride region by radicals generated from the hydrofluorocarbon contained in the deposit,
    wherein the first process and the second process are repeated alternately.

2. The etching method of claim 1,
    wherein the silicon-containing region contains at least one silicon compound selected from the group consisting of SiC, SiOC, SiON, SiCN, SiOCN and $SiO_2$.

3. The etching method of claim 1,
    wherein the hydrofluorocarbon gas contains at least one gas selected from the group consisting of $CH_3F$, $CH_2F_2$ and $CHF_3$.

4. The etching method of claim 1,
    wherein a ratio between a period of the first process and a period of the second process is set such that an etching amount of the silicon nitride region is at least five times as large as an etching amount of the silicon-containing region.

5. The etching method of claim 1,
wherein, in the second process, the radicals generated from the hydrofluorocarbon contained in the deposit are generated by exposing the deposit to the plasma of the rare gas.

6. The etching method of claim 1,
wherein an oxygen gas concentration in the processing gas is equal to or less than $2.0 \times 10^{-10}$ mol/cm$^3$.

7. The etching method of claim 1,
wherein the second process includes generating the plasma from the rare gas and exposing a surface of the processing target object to the generated plasma.

8. The etching method of claim 1,
wherein, in the first process and the second process, a temperature of the processing target object is set to be in the range from 0° C. to 100° C.

9. The etching method of claim 1,
wherein the first process and the second process are performed in the same processing vessel without carrying-out the processing target object.

10. The etching method of claim 1,
wherein, in the first process, a surface of the silicon nitride region is modified.

11. The etching method of claim 1,
wherein the silicon nitride region and the silicon-containing region are exposed.

12. The etching method of claim 1,
wherein the silicon-containing region comprises a SiCN region containing SiCN and a SiC region containing SiC.

13. The etching method of claim 1,
wherein the silicon-containing region contains at least one silicon compound selected from the group consisting of SiC, SiOC, SiON, SiCN, SiOCN and SiO$_2$, and
wherein the hydrofluorocarbon gas contains at least one gas selected from the group consisting of CH$_3$F, CH$_2$F$_2$ and CHF$_3$.

14. The etching method of claim 1,
wherein a ratio of a processing time of the first process with respect to a sum of processing times of the first and second processes is set to be in a range from 5% to 30%.

15. The etching method of claim 1,
wherein the processing vessel includes a lower electrode on which the processing target object is placed and an upper electrode facing the lower electrode, and
wherein, in the first process, a pressure of a space within the processing vessel is set to a pressure within a range from 20 mTorr to 50 mTorr, and a distance between the upper electrode and a top surface of a mounting table including the lower electrode is set to be in a range from 20 mm to 50 mm.

16. The etching method of claim 1,
wherein the processing vessel includes a lower electrode on which the processing target object is placed and an upper electrode facing the lower electrode, and
wherein, in the first process, a negative voltage is applied to the upper electrode.

17. The etching method of claim 1,
wherein the processing vessel includes a lower electrode on which the processing target object is placed and an upper electrode facing the lower electrode, and
wherein, in the second process, a pressure of a space within the processing vessel is set to a pressure within a range from 20 mTorr to 50 mTorr, and a distance between the upper electrode and a top surface of a mounting table including the lower electrode is set to be in a range from 20 mm to 50 mm.

18. The etching method of claim 1,
wherein the processing vessel includes a lower electrode on which the processing target object is placed and an upper electrode facing the lower electrode, and
wherein, in the second process, a negative voltage is applied to the upper electrode.

19. An etching method, comprising:
accommodating, within a processing vessel, a processing target object having a silicon nitride region and a silicon-containing region, wherein the silicon-containing region has a composition different from the silicon nitride region, and the silicon nitride region and the silicon-containing region are exposed;
a first process of forming a deposit containing hydrofluorocarbon on the silicon nitride region and the silicon-containing region by generating plasma from a processing gas containing a hydrofluorocarbon gas within the processing vessel; and
a second process of sputtering the deposit by active species of atoms of a rare gas in plasma generated from the rare gas and etching the silicon nitride region by radicals generated from the hydrofluorocarbon contained in the deposit,
wherein, in the first process, a thickness of the deposit formed on the silicon-containing region is thicker than a thickness of the deposit formed on the silicon nitride region, and
in the second process, the deposit on the silicon-containing region suppresses the silicon-containing region from being substantially etched, and
a ratio of a processing time of the first process with respect to a sum of processing times of the first and second processes is set to be in a range from 5% to 30%.

20. The etching method of claim 19,
wherein the silicon-containing region comprises a SiCN region containing SiCN and a SiC region containing SiC.

* * * * *